United States Patent
Choi et al.

(10) Patent No.: US 8,228,720 B2
(45) Date of Patent: Jul. 24, 2012

(54) NONVOLATILE MEMORY DEVICES INCLUDING VARIABLE RESISTIVE ELEMENTS

(75) Inventors: Byung-Gil Choi, Gyeonggi-do (KR); Hye-Jin Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 364 days.

(21) Appl. No.: 12/556,787

(22) Filed: Sep. 10, 2009

(65) Prior Publication Data

US 2010/0061146 A1 Mar. 11, 2010

(30) Foreign Application Priority Data

Sep. 11, 2008 (KR) ........................ 10-2008-0089980

(51) Int. Cl.
*G11C 7/04* (2006.01)
*G11C 8/08* (2006.01)
*G11C 11/21* (2006.01)
*G11C 8/10* (2006.01)

(52) U.S. Cl. .................... 365/163; 365/211; 365/230.06

(58) Field of Classification Search .................. 365/148, 365/163, 185.23, 211, 230.06
See application file for complete search history.

(56) References Cited

U.S. PATENT DOCUMENTS

| 7,383,149 B1 * | 6/2008 | Walker .......................... 702/130 |
| 2008/0084738 A1 | 4/2008 | Philip et al. | |

FOREIGN PATENT DOCUMENTS

| KR | 1020050020356 | 3/2005 |
| KR | 1020050058931 | 6/2005 |
| KR | 1020050107199 | 11/2005 |

* cited by examiner

*Primary Examiner* — J. H. Hur
(74) *Attorney, Agent, or Firm* — Myers Bigel Sibley & Sajovec, P.A.

(57) ABSTRACT

A nonvolatile memory device may include a memory cell array having a plurality of nonvolatile memory cells arranged in a matrix including a plurality of rows of the nonvolatile memory cells. Each of a plurality of word lines may be coupled with nonvolatile memory cells of a respective row of the matrix. A row decoder may be coupled to the plurality of word lines with the row decoder being configured to disable at least one of the word lines using a row bias having a level that is adjusted responsive to changes in temperature. Such a nonvolatile memory device may operate with reduced standby currents.

22 Claims, 8 Drawing Sheets

NONVOLATILE MEMORY DEVICES INCLUDING VARIABLE RESISTIVE ELEMENTS

CROSS-REFERENCE TO RELATED APPLICATION

This application claims priority from Korean Patent Application No. 10-2008-0089980 filed on Sep. 11, 2008 in the Korean Intellectual Property Office, the disclosure of which is incorporated herein by reference in its entirety.

BACKGROUND OF THE INVENTION

1. Field of the Invention

The present invention relates to nonvolatile memory devices using variable resistive elements.

2. Description of the Related Art

Examples of a nonvolatile memory devices using resistance materials include phase change random access memory (PRAM) devices, resistive RAM (RRAM) devices, and magnetic RAM (MRAM) devices. Dynamic RAM (DRAM) devices and flash memory devices store data using electric charge, while nonvolatile memory devices that use resistance materials store data using a change in state of a phase change material (PRAM), such as a chalcogenide alloy; a change in resistance of a variable resistive material (RRAM); or a change in resistance of a magnetic tunnel junction (MTJ) thin film due to a magnetization state of a ferromagnetic substance (MRAM).

The following description uses a phase change memory cell as an example. A state of a phase change material is changed to a crystal state or an amorphous state while being cooled after a heating process. Since the phase change material in the crystal state has low resistance and the phase change material in the amorphous state has high resistance, the crystal state may be defined as set data or 0 data, and the amorphous state may be defined as reset data or 1 data.

SUMMARY OF THE INVENTION

Embodiments of the present invention may provide nonvolatile memory devices with low standby current.

According to some embodiments of the present invention, a nonvolatile memory device may include a memory cell array including a plurality of nonvolatile memory cells arranged in a matrix, a plurality of word lines respectively coupled with rows of the nonvolatile memory cells, and a row decoder disabling at least one of the plurality of word lines using a row bias. The row bias may have a level that is adjusted using an external temperature.

According to some other embodiments of the present invention, a nonvolatile memory device may include a memory cell array having a plurality of nonvolatile memory cells arranged in a matrix, a plurality of sub word lines respectively coupled with rows of the nonvolatile memory cells, and a row decoder that is coupled between a plurality of main word lines and the plurality of sub word lines. The row decoder may adjust the levels of the sub word lines according to the levels of the main word lines and may disable at least one of the plurality of sub word lines using a row bias. A row biasing generating unit may provide the row bias to the row decoder in response to a biasing signal, and a biasing signal generating unit may provide the biasing signal having a level that is determined using the external temperature.

According to some other embodiments of the present invention, a nonvolatile memory device may include a memory cell array having a plurality of nonvolatile memory cells arranged in a matrix, and a plurality of word lines respectively coupled with rows of the nonvolatile memory cells. When the plurality of word lines are disabled, the level of each of the plurality of word lines at a first temperature may be equal to the level thereof at a second temperature higher than the first temperature.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

Advantages and features of the present invention and methods of accomplishing the same may be understood more readily by reference to the following detailed description of preferred embodiments and the accompanying drawings. The present invention may, however, be embodied in many different forms and should not be construed as being limited to embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

It will be understood that when an element is referred to as being "connected to" or "coupled to" another element, it can be connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, etc. may be used herein to describe various elements, components, and/or sections, these elements, components, and/or sections should not be limited by these terms. These terms are only used to distinguish one element, component or section from another element, component, or section. Thus, a first element, component, or section discussed below could be termed a second element, component, or section without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In addition, when terms used in this specification are not specifically defined, all the terms used in this specification (including technical and scientific terms) can be understood by those skilled in the art. Further, when general terms defined in the dictionaries are not specifically defined, the terms will have the normal meaning in the art.

Hereinafter, a description will be made of embodiments of the present invention using phase change random access memory (PRAM) devices. However, it will be understood by those skilled in the art that embodiments of the present invention can be applied to nonvolatile memory devices that use resistance materials, such as resistive RAM (RRAM) devices, ferroelectric RAM (FRAM) devices, etc.

Figure 1:
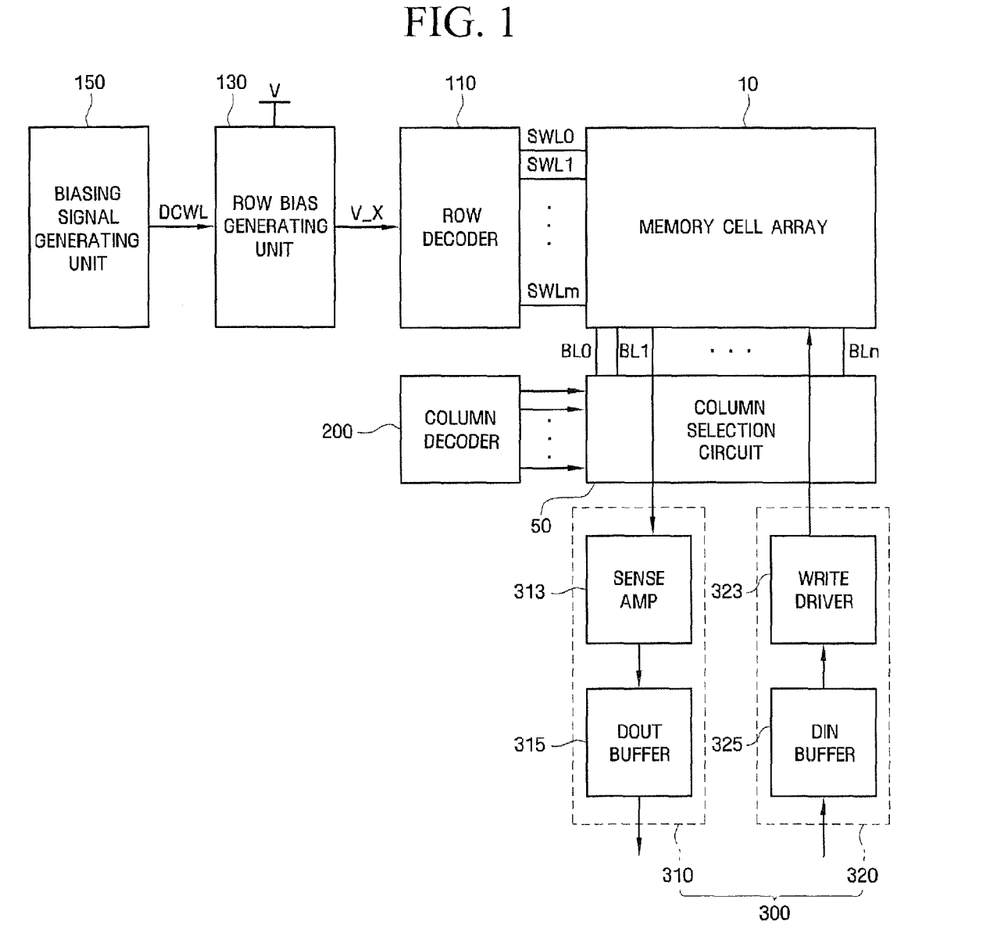
FIG. 1 is a block diagram illustrating nonvolatile memory devices according to some embodiments of the present invention.
Figure 2:
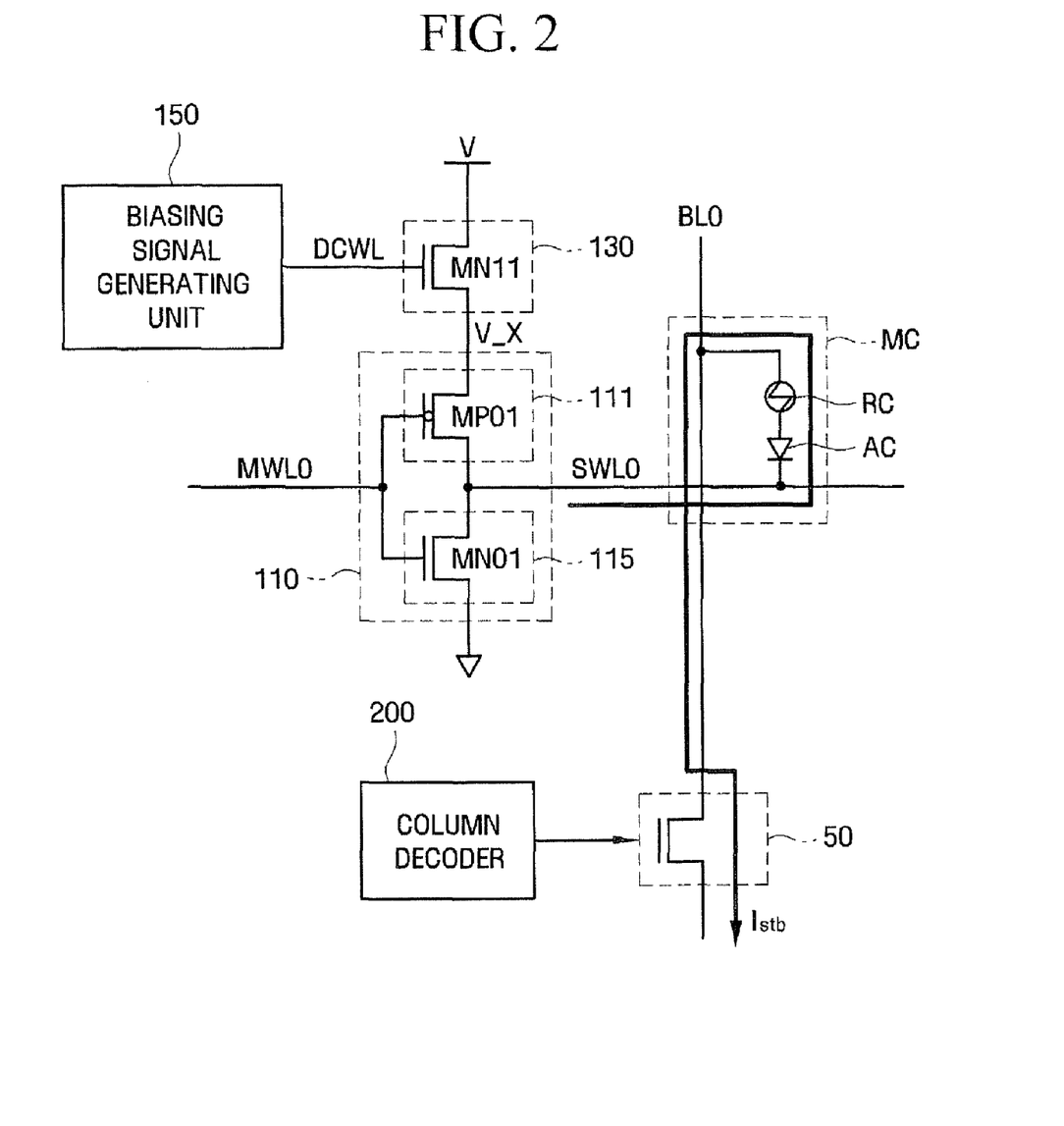
FIG. 2 is a circuit diagram illustrating blocks shown in FIG. 1.

FIG. 1 is a block diagram illustrating nonvolatile memory devices according to some embodiments of the present invention, and FIG. 2 is a circuit diagram illustrating blocks shown in FIG. 1. For convenience of explanation, FIG. 2 shows a part of a nonvolatile memory device connected to a first sub word line SWL0 and a first main word line MWL0.

Referring to FIGS. 1 and 2, a nonvolatile memory device according to some embodiments of the present invention includes a memory cell array 10, a column selection circuit 50, a column decoder 200, a row decoder 110, a row bias generating unit 130, a biasing signal generating unit 150, and an input/output (I/O) circuit 300.

The memory cell array 10 includes a plurality of nonvolatile memory cells MC arranged in a matrix of rows and columns. Rows of nonvolatile memory cells MC are coupled to respective sub word lines SWL0 through SWLm while columns of nonvolatile memory cells MC are coupled to respective bit lines BL0 through BLn.

Each of the plurality of nonvolatile memory cells includes a variable resistive element RC having a phase change material with two different resistance values depending on whether the material is in a crystalline or amorphous state and an access element AC that controls a current flowing through the variable resistive element RC. The access element AC may be a diode, a transistor, or the like, which is connected in series with the variable resistive element RC. While FIG. 2 shows a diode is used as the access element AC, another type of device may be used as the access element. A phase change nonvolatile memory cell using a diode as the access element AC is referred to as a diode-controlled PRAM cell. Further, examples of the phase change materials may include various kinds of materials, such as GaSb, InSb, InSe, $Sb_2Te_3$, and GeTe in which two elements are chemically combined with each other, GeSbTe, GaSeTe, InSbTe, $SnSb_2Te_4$, and InSbGe in which three elements are chemically combined with one another, and/or AgInSbTe, (GeSn)SbTe, GeSb(SeTe), and $Te_{81}Ge_{15}Sb_2S_2$ in which four elements are chemically combined with one another. Among them, GeSbTe that contains germanium (Ge), antimony (Sb), and tellurium (Te) is mainly used as the phase change material.

As demands for nonvolatile memory devices having high capacity and high integration density have increased, the nonvolatile memory device may have a hierarchical bit line structure employing global and local bit lines. Similarly, the nonvolatile memory device may also have a hierarchical word line structure employing main word lines (e.g., MWL0) and sub word lines (e.g., SWL0). As used herein, the term word line may refer generically to a main word line or a sub word line.

The column selection circuit 50 selects at least one of the plurality of bit lines BL0 through BLn such as a bit line BL0. More specifically, the column selection circuit 50 selects some of the plurality of bit lines BL0 through BLn and couples them to the I/O circuit 300 in response to a column selection signal provided by the column decoder 200.

The row decoder 110 adjusts the level of each of the plurality of sub word lines SWL0 through SWLm and selects at least one of them. More specifically, the row decoder 110 adjusts the level of the plurality of sub word lines SWL0 through SWLm to a first voltage level using a row bias V_X and disables at least one of the plurality of sub word lines SWL0 through SWLm. The row decoder 110 also adjusts the level of the plurality of sub word lines SWL0 through SWLm and enables at least one of them. In particular, if a nonvolatile memory cell MC is a diode-controlled PRAM cell, the row decoder 110 may adjust the selected sub word line (e.g., SWLm) to a voltage level so as to turn on the diode.

If a nonvolatile memory device has a hierarchical word line structure using main word lines WL0 through WLm and sub word lines SWL0 through SWLm, the row decoder 110 is coupled between the main word lines MWL0 through MWLm and the sub word lines SWL0 through SWLm and adjusts the levels of the sub word lines SWL0 through SWLm according to the levels of the main word lines MWL0 through MWLm. The row decoder 110 includes pull-up and pull-down elements 111 and 115.

The pull-down element 115 pulls down the voltage levels of the sub word lines SWL0 through SWLm to enable the sub word lines SWL0 through SWLm in response to voltage levels applied to the main word lines MWL0 through MWLm. For example, the pull-down element 115 may include an NMOS transistor MN01 that is coupled between a ground voltage and the sub word line SWL0 and has a gate to which a voltage applied to the main word line MWL0 is delivered.

The pull-up element 111 pulls up the voltage levels of the sub word lines SWL0 through SWLm to disable the sub word lines SWL0 through SWLm in response to voltage levels applied to the main word lines MWL0 through MWLm. For example, the pull-up element 111 may include a PMOS transistor MP01 that is coupled between the row bias generating unit 130 and the sub word line SWL0 and has a gate to which a voltage applied to the main word line MWL0 is delivered.

The row bias generating unit 130 receives an operating bias V and provides a row bias V_X to the row decoder 110 in response to a biasing signal DCWL. In this case, the level of the row bias V_X may be adjusted based on the temperature sensed outside the nonvolatile memory device, to be called "external temperature" hereinafter. More specifically, the level of the row bias signal V_X provided by the row bias generating unit 130 may be adjusted in response to the biasing signal DCWL having a level determined using the external temperature.

The row bias generating unit 130 may include an NMOS transistor MN11 that is coupled between the operating bias V and the row decoder 110 and has a gate to which the biasing signal DCWL is applied. Unlike the biasing signal DCWL, a voltage level of the operating bias V is not determined according to the external temperature. For example, the operating bias V may be a supply voltage or a voltage elevated from the supply voltage.

The biasing signal generating unit 150 provides the biasing signal DCWL having a level determined using the external temperature to the row decoder 110. In this case, the biasing signal DCWL may have a first level at a first temperature and a second level lower than the first level at a second temperature higher than the first temperature. That is, the level of the biasing signal DCWL may be inversely proportional to the external temperature. The operation of the biasing signal generating unit 150 is described in more detail later with reference to FIGS. 3A and 3B. A circuit configuration of the biasing signal generating unit 150 is also described in greater detail later with reference to FIGS. 5 and 6.

The I/O circuit 300 is coupled to bit lines and inputs and/or outputs data to and/or from the memory cell array 10. The I/O circuit 300 includes a read circuit 310 and a write circuit 320.

The write circuit 320 is coupled to the bit lines to write data into the memory cell array 10 and includes a data input buffer 325 and a write driver 323. The data input buffer 325 receives and stores external data and delivers the buffered data to the write driver 323. The write driver 323 writes data into a nonvolatile memory cell MC in the memory cell array 10.

The read circuit 310 is coupled to the plurality of bit lines BL0 through BLn to read data from the memory cell array 10. The read circuit 310 includes a sense amplifier (AMP) 313 configured to read data from a nonvolatile memory cell MC in the memory cell array 10 and a data output buffer 315 configured to output the read data.

Operation of a nonvolatile memory device according to some embodiments of the present invention is described in greater detail with reference to FIGS. 2 through 4B.

Figure 3A:
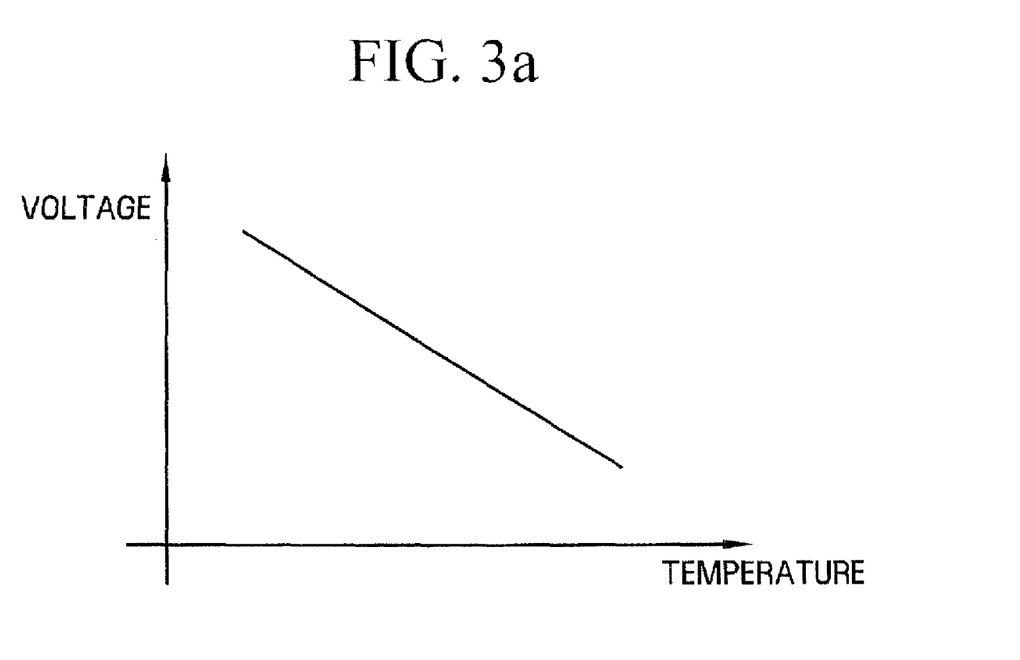
FIGS. 3A and 3B are graphs illustrating changes in the level of a biasing signal with respect to temperature in nonvolatile memory devices according to some embodiments of the present invention.
Figure 3B:
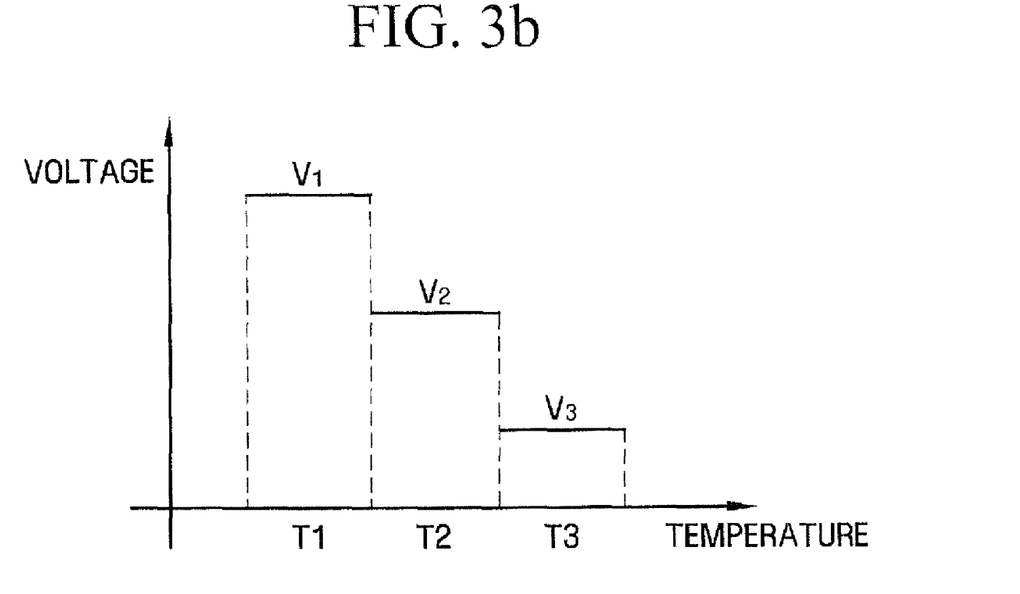

FIGS. 3A and 3B illustrate a change in the level of a biasing signal with respect to temperature in a nonvolatile memory device according to some embodiments of the present invention.

First, referring to FIG. 2, the row decoder 110 pulls up/down the voltage levels of the sub word lines SWL0 through SWLm to disable/enable the sub word lines SWL0 through SWLm. More specifically, during an active period, row decoder 110 pulls down the level of a selected one(s) of the sub word lines SWL0 through SWLm using a ground voltage to enable the selected sub word line. On the other hand, the row decoder 110 pulls up an unselected one(s) of the sub word lines SWL0 through SWLm using the row bias V_X to disable the unselected sub word line(s) during an active period. Alternatively, during a standby period, the row decoder 110 may pull up the level of each of the sub word lines SWL0 through SWLm to disable all of the sub word lines.

When a sub word line(s) is disabled using the row bias V_X provided by the row bias generating unit 130, the level of the disabled sub word line(s) may vary with the external temperature. More specifically, as the external temperature rises, threshold voltages Vth of the transistor MN11 in the row bias generating unit 130 and the transistor MP01 in the row decoder 110 decrease. As a result, as the external temperature rises, the level of the sub word lines SWL0 through SWLm may increase as shown in straight line a of FIG. 4C.

On the other hand, a threshold voltage of the access element AC (i.e., diode) in the non-volatile memory cell MC may decrease as the external temperature increases, thereby causing an increase of reverse current in the access element AC. More specifically, as the external temperature rises, levels of the sub word lines SWL0 through SWLm may increase while a threshold voltage of the access element AC in the non-volatile memory cell MC decreases. A subsequent increase of a reverse current in the access element AC may increase the standby current Istb consumed during a standby period within the nonvolatile memory device. This may also increase a length of time taken to discharge a bit line, e.g., BL0 to a ground voltage level upon a transition from the standby state to the active state, thereby reducing the speed of transition.

However, since in embodiments of the present invention, the level of the row bias V_X is adjusted in response to the biasing signal DCWL having a level determined using the external temperature, it is also possible to adjust an increase in the level of the sub word lines SWL0 through SWLm as the external temperature rises. Thus, an amount of reverse current that flows through the access element AC in the nonvolatile memory cell MC and/or an amount of standby current Istb absorbed during the standby period can be reduced. Further, a speed of transition from the standby state to the active state can be improved.

More specifically, biasing signal generating unit 150 may provide a biasing signal DCWL having a level that is determined based on the external temperature. In this case, the biasing signal DCWL has a first level at a first temperature and a second level lower than the first level at a second temperature higher than the first temperature. That is, the level of the biasing signal DCWL is inversely proportional to the external temperature, which means the level of the biasing signal DCWL decreases as the external temperature increases.

For example, the biasing signal generating unit 150 may provide the biasing signal DCWL having a level that is continuously inversely proportional to the external temperature as shown in FIG. 3A. That is, the level of the biasing signal DCWL may continuously decrease as the external temperature rises.

In a nonvolatile memory device according to other embodiments of the present invention, the biasing signal generating unit 150 may provide the biasing signal DCWL having a level that is discontinuously inversely proportional to the external temperature as shown in FIG. 3B. More specifically, the biasing signal DCWL may have first through third voltage levels $V_1$ through $V_3$ that decrease stepwise at first through third temperature intervals T1 through T3. That is, as the external temperature increases, the level of the biasing signal DCWL may decrease stepwise from $V_1$ to $V_3$.

According to embodiments of the present invention, even if the threshold voltages of the transistor MN11 in the row bias generating unit 130 and/or transistor MP0 in the row decoder 110 decrease as the external temperature rises, the biasing signal generating unit 150 provides a biasing signal DCWL having a relatively low level, thereby allowing for adjustment of the extent in which the level of sub word lines SWL0 through SWLm increases.

Figure 4A:
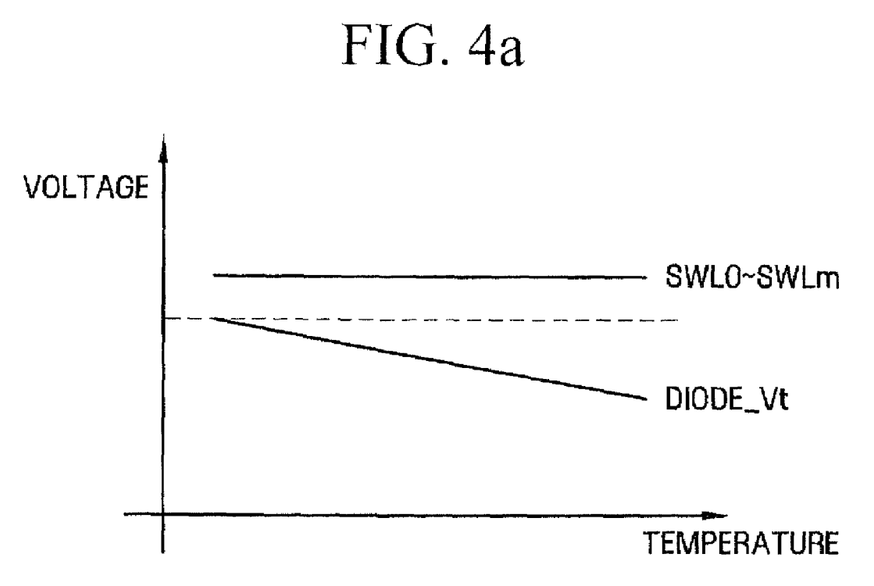
FIGS. 4A through 4C are graphs illustrating changes in the level of sub word lines with respect to an external temperature according to some embodiments of the present invention.
Figure 4B:
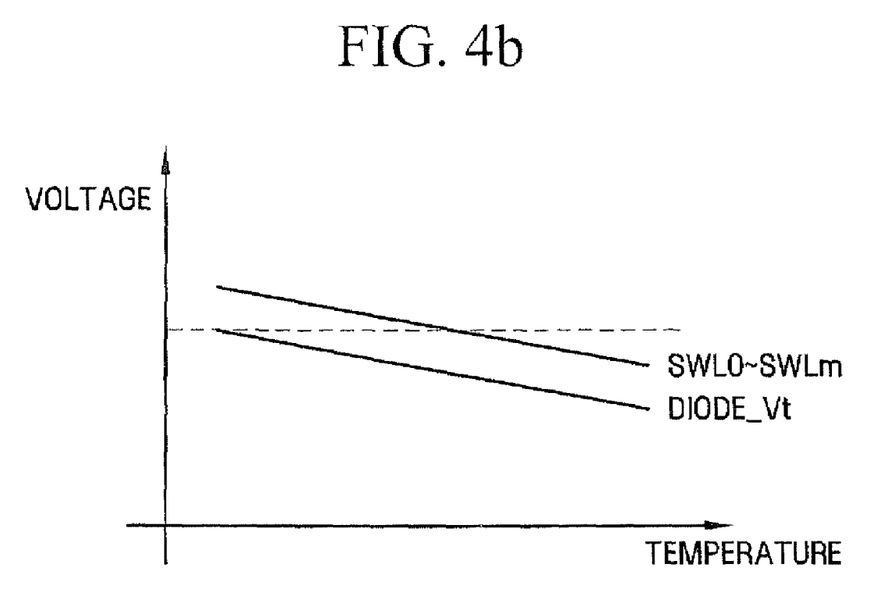
Figure 4C:
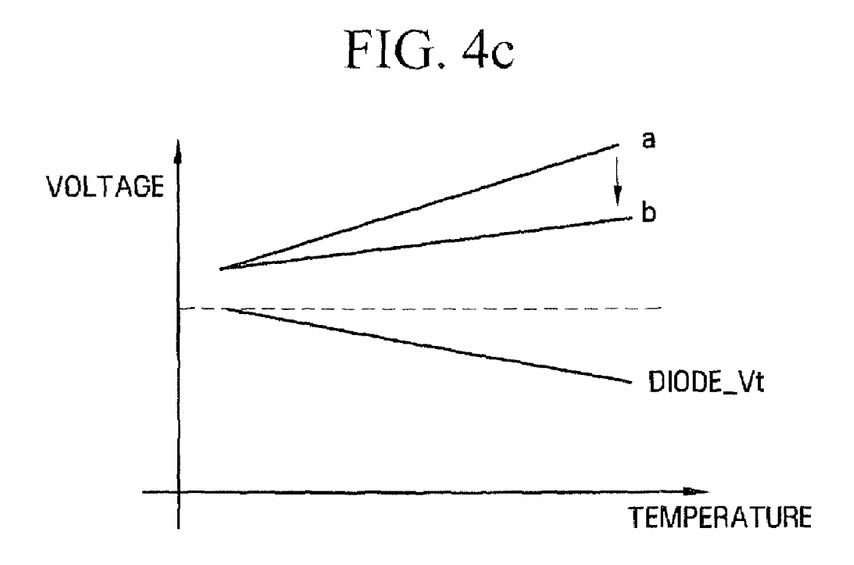

FIGS. 4A through 4C illustrate changes in levels of sub word lines with respect to a temperature sensed outside nonvolatile memory devices according to some embodiments of the present invention.

Referring to FIG. 4A, when each of the sub word lines SWL0 through SWLm is disabled in a nonvolatile memory device according to some embodiments of the present invention, the level of the sub word line at the first temperature may be equal to the level thereof at the second temperature. That is, the level of the sub word line may be kept substantially constant regardless of change in the external temperature. More specifically, as the external temperature rises, the level of a sub word line may increase due to a decrease in a threshold voltage of transistor MN11 and/or MP01, to substantially the same extent that it decreases with a decreased voltage level of a biasing signal DCWL. Thus, the level of the sub word line may be kept substantially constant in spite of a varying external temperature. In this case, the level of the sub word line may be as low as possible while preventing the access element AC in the nonvolatile memory cell MC from turning on. For example, the sub word line may have a lowest level that is higher than a threshold voltage of the access element AC at a relatively low temperature.

Nonvolatile memory devices according to embodiments described with reference to FIG. 4A can reduce increases in reverse current in the access element AC with increasing temperatures while providing that the access element AC does not turn on in spite of changes in threshold voltage due to a varying external temperature.

Referring to FIG. 4B, when each of the sub word lines SWL0 through SWLm are disabled in a nonvolatile memory device according to other embodiments of the present invention, the level of a sub word line may decrease with increasing external temperatures. More specifically, as the external temperature rises, a level of sub word line increases due to a decrease in a threshold voltage of transistor MN11 and/or MP01 may be less than decreases due to a decreased voltage level of a biasing signal DCWL. Thus, as the external temperature rises, the level of a sub word line may decrease. In this case, a level of the sub word line may vary within a range that can prevent the access element AC in the nonvolatile memory cell MC from turning on.

In nonvolatile memory devices including sub word lines SWL0 through SWLm with varying levels according to embodiments described with reference to FIG. 4B, voltage levels of disabled sub word lines may decrease together with the threshold voltage of the access element(s) AC in the nonvolatile memory cell(s) MC as the external temperature increases, thereby effectively reducing reverse current in the access element(s) AC.

Referring to FIG. 4C, when each of the sub word lines SWL0 through SWLm is disabled in a nonvolatile memory device according to other embodiments of the present invention, a voltage level of a sub word line may increase slightly with an increasing external temperature. More specifically, as the external temperature rises, a voltage level of sub word line may increase due to a decrease in a threshold voltage of transistor MN11 and/or MP01, these voltage level increases may exceed decreases due to decreased voltage level of a biasing signal DCWL. Thus, as the external temperature rises, the voltage level of a sub word line may decrease. In this case, the level of the sub word line may vary within a range that can prevent the access element AC in the nonvolatile memory cell MC from turning on. However, by providing a biasing signal having a level inversely proportional to the external temperature (See straight line b), the voltage level of a sub word line can be increased with an increasing external temperature to a less extent than when providing a biasing signal having a level that remains constant regardless of change in external temperature (See straight line a). Thus, nonvolatile memory devices according to some embodiments described with reference to FIG. 4C can reduce reverse current in the access element AC in nonvolatile memory cell MC.

Figure 5:
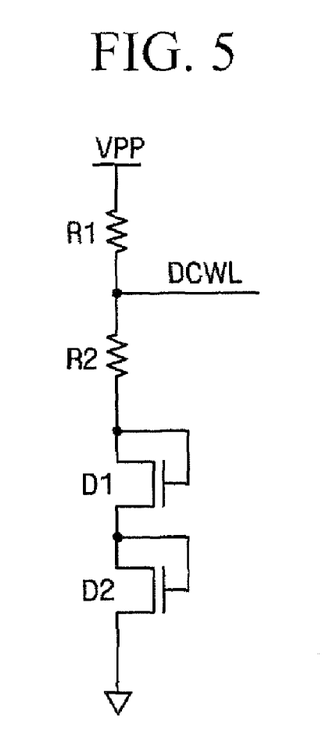
FIGS. 5 and 6 are circuit diagrams illustrating biasing signal generating units shown in FIG. 2.
Figure 6:
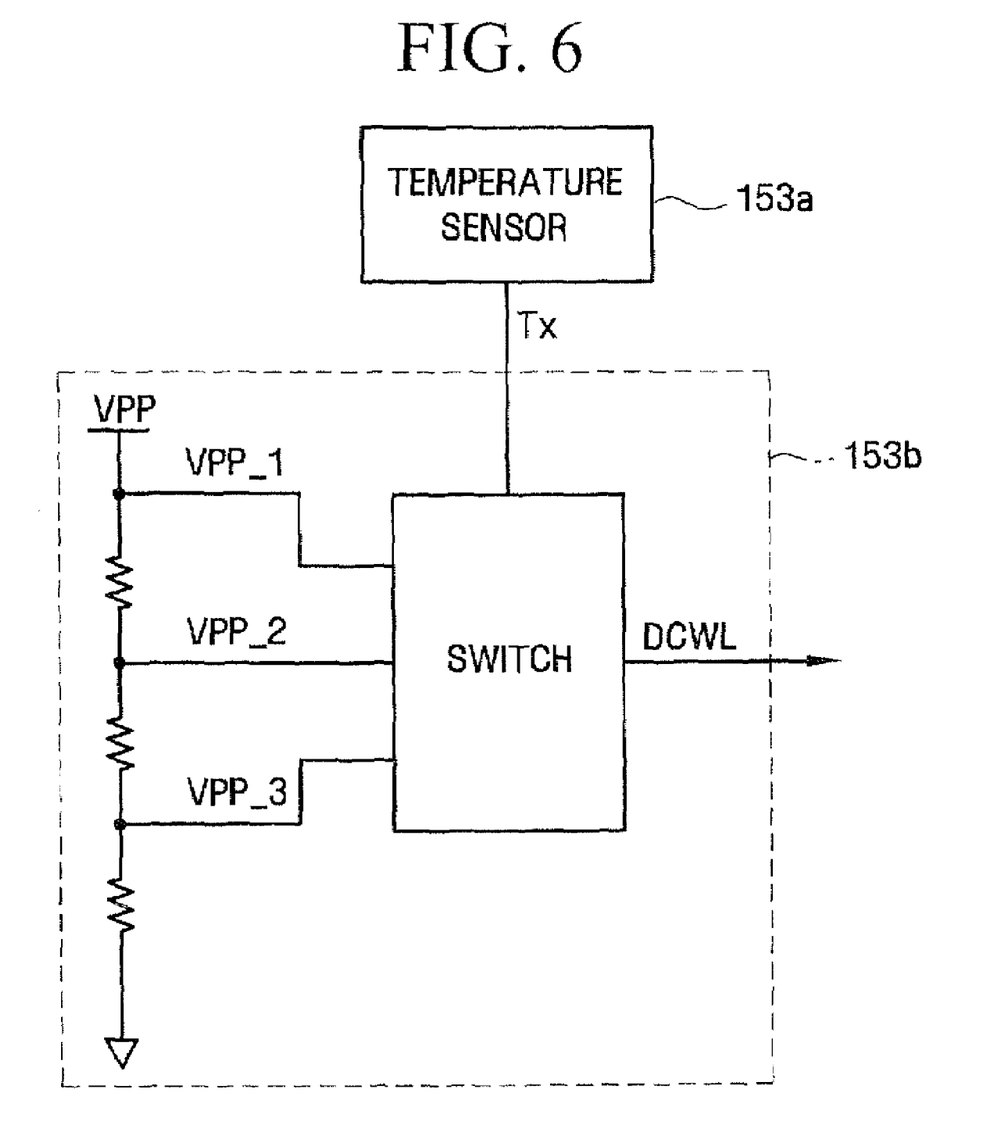

FIGS. 5 and 6 are circuit diagrams of biasing signal generating unit 150 shown in FIG. 2.

Referring to FIG. 5, the biasing signal generating unit 150 may include diodes D1 and D2 and resistance elements R1 and R2 coupled in series. More specifically, the biasing signal generating unit 150 may include diodes D1 and D2 coupled between resistance elements R1 and R2 and a ground voltage and the row of resistance elements R1 and R2 coupled between diodes D1 and D2 and a boosted power supply VPP.

In this case, diodes D1 and D2 may be diode-type transistors having a gate of a MOS transistor coupled with a source or drain.

Since internal resistances of diodes D1 and D2 and resistances of resistance elements R1 and R2 vary continuously depending on changes of external temperature, the biasing signal generating unit 150 can supply a biasing signal DCRM having a level determined using the external temperature, and more specifically, a level that is continuously inversely proportional with respect to the external temperature as shown in FIG. 3A.

Referring to FIG. 6, the biasing signal generating unit 150 may include a temperature sensor 153a providing a temperature signal TX in response to an external temperature and a biasing signal generator 153b generating a biasing signal DCWL having a voltage level that varies depending on the temperature signal TX. Although not shown in FIG. 5, the temperature sensor 153a may include a plurality of temperature branches that output a plurality of temperature signals in response to different external temperatures. Further, the biasing signal generator 153b may include a voltage distributor providing different voltage levels VPP_1 through VPP_3 and a switch selecting one of the different voltage levels VPP_1 through VPP_3 and providing the selected voltage level as the biasing signal DCRM.

While FIG. 6 shows the biasing signal generating unit 150 providing a biasing signal DCWL that is discontinuously inversely proportional to temperature as illustrated in FIG. 3B in response to the temperature signal TX provided by the temperature sensor 153a, the biasing signal generating unit 150 may supply a column bias having a level continuously inversely proportional with respect to the temperature like in FIG. 3, in response to the temperature signal TX.

Figure 7:
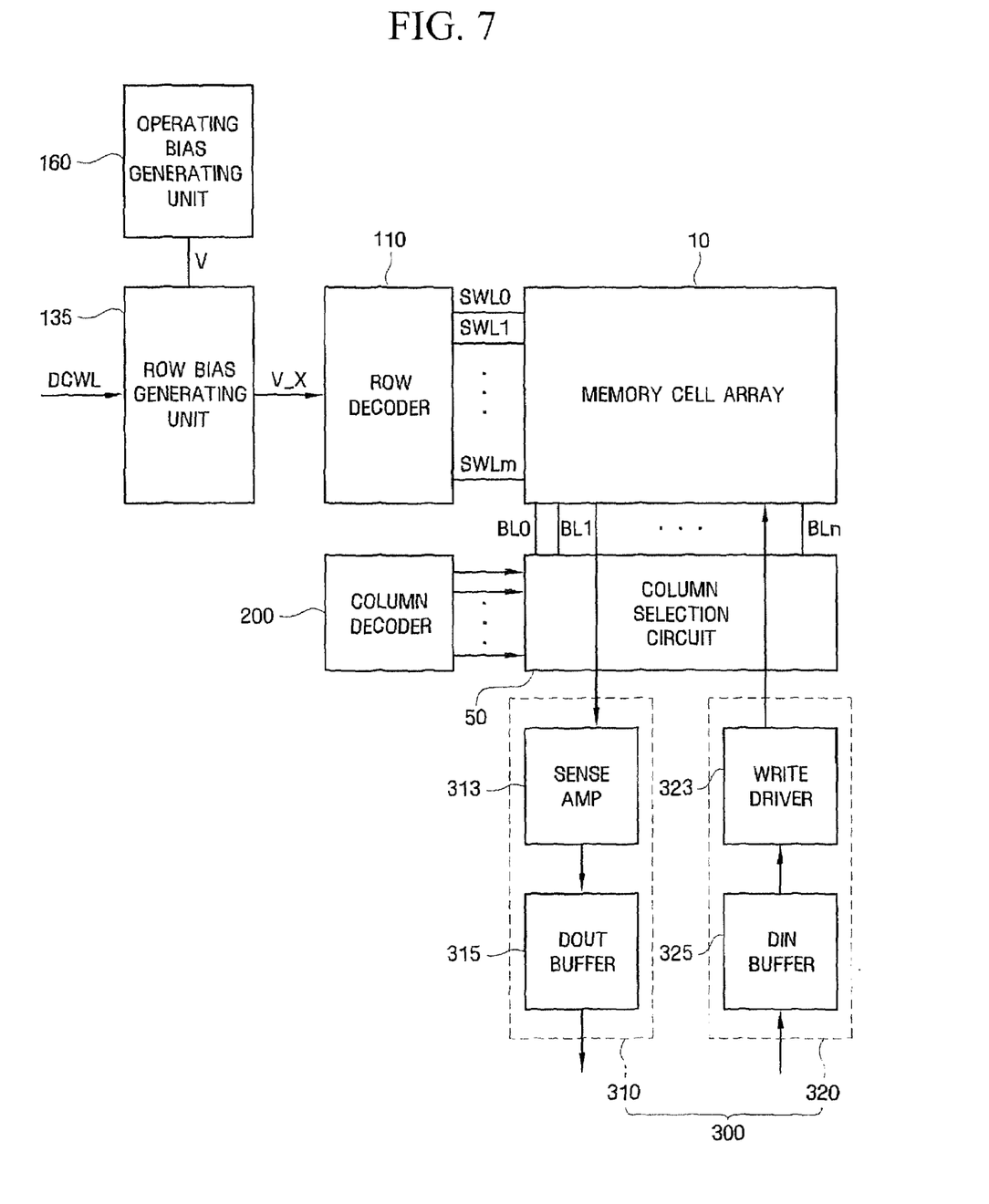
FIG. 7 is a block diagram illustrating nonvolatile memory devices according to other embodiments of the present invention.
Figure 8:
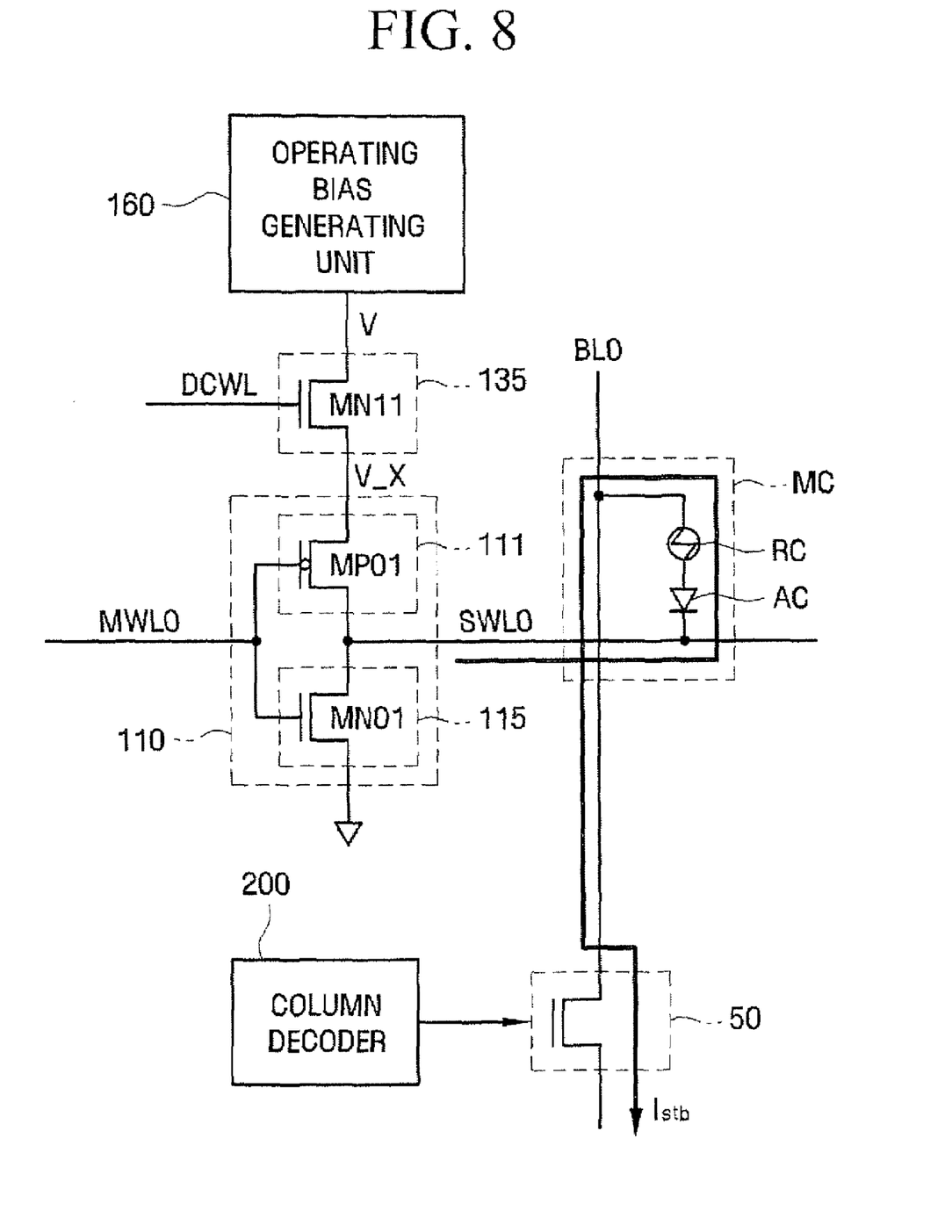
FIG. 8 is a circuit diagram illustrating blocks shown in FIG. 7.

FIG. 7 is a block diagram illustrating a nonvolatile memory device according to other embodiments of the present invention, and FIG. 8 is a circuit diagram illustrating blocks shown in FIG. 7.

Referring to FIGS. 7 and 8, unlike nonvolatile memory devices described above, a nonvolatile memory device according to other embodiments of the present invention may include an operating bias generating unit 160 delivering an operating bias V having a voltage level determined using an external temperature to the row bias generating unit 135. According to embodiments of the present embodiment, a level of a biasing signal DCWL being delivered to the row bias generating unit 135 is not determined using the external temperature. That is, the biasing signal DCWL has a level that remains substantially constant regardless of the external temperature.

More specifically, the nonvolatile memory device may further include the operating bias generating unit 160 delivering the operating bias V having a voltage level determined using the external temperature to the row bias generating unit 135. In this case, the operating bias V may have a first level at a first temperature and a second level lower than the first level at a second temperature higher than the first temperature. That is, the level of the operating bias V may be inversely proportional with respect to the external temperature.

Thus, since the level of the operating bias V is determined depending on the external temperature unlike the biasing signal DCWL, it is possible to adjust an increase in the level of sub word lines SWL0 through SWLm over the external temperature. That is, even if the level of sub word lines SWL0 through SWLm increases due to a decrease in threshold voltage of the transistor MN11 and/or MP01 when the external temperature increases, the extent to which the level of sub word lines SWL0 through SWLm increases can be adjusted by providing the operating bias V having a relatively low voltage level.

When the operating bias V having a voltage level determined using the external temperature is provided, changes in the level of sub word lines SWL0 through SWLm may occur similarly to those described with reference to FIGS. 4A through 4C. Further, the operating bias generating unit 160 may have substantially similar structure and function to that described with reference to FIGS. 3A, 3B, 5 and 6. Thus, a detailed explanation thereof will not be given herein.

While the present invention has been particularly shown and described with reference to particular embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A nonvolatile memory device comprising:
   a memory cell array including a plurality of nonvolatile memory cells arranged in a matrix including a plurality of rows of the nonvolatile memory cells;
   a plurality of word lines wherein each of the plurality of word lines is coupled with nonvolatile memory cells of a respective row of the matrix; and
   a row decoder coupled to the plurality of word lines wherein the row decoder is configured to disable at least one of the word lines using a row bias having a positive voltage level that is determined responsive to changes in temperature.

2. The nonvolatile memory device of claim 1, further comprising:
   a row bias generating unit receiving an operating bias and supplying the row bias to the row decoder in response to a biasing signal; and
   a biasing signal generating unit configured to generate the biasing signal having a positive voltage level that is adjusted responsive to the temperature.

3. The nonvolatile memory device of claim 2, wherein the biasing signal has a first positive voltage level at a first temperature and a second positive voltage level lower than the first positive voltage level at a second temperature higher than the first temperature.

4. The nonvolatile memory device of claim 2, wherein the biasing signal generating unit includes a temperature sensor providing a temperature signal in response to the temperature and a biasing signal generator configured to generate the biasing signal wherein the positive voltage level is determined responsive to the temperature signal so that the biasing signal has different voltage levels at different temperatures.

5. The nonvolatile memory device of claim 2, wherein the biasing signal generating unit includes at least one diode and a plurality of resistance elements coupled in series with the at least one diode between a power supply voltage and a reference voltage.

6. The nonvolatile memory device of claim 1, further comprising:
   a row bias generating unit configured to receive an operating bias and to supply the row bias to the row decoder in response to a biasing signal; and
   an operating bias generating unit configured to generate the operating bias having a level that is adjusted responsive to the temperature.

7. The nonvolatile memory device of claim 6, wherein the operating bias generating unit is configured to generate the operating bias having a first level at a first temperature and a second level lower than the first level at a second temperature higher than the first temperature.

8. The nonvolatile memory device of claim 1, wherein when the plurality of word lines are disabled, levels of each of the plurality of word lines at a first temperature is equal to the levels thereof at a second temperature higher than the first temperature.

9. The nonvolatile memory device of claim 1, wherein when the plurality of word lines are disabled, each of the plurality of word lines has a first level at a first temperature and a second level lower than the first level at a second temperature higher than the first temperature.

10. The nonvolatile memory device of claim 1, wherein the plurality of word lines include a plurality of main word lines and a plurality of sub word lines and wherein the row decoder is coupled between the plurality of main word lines and the plurality of sub word lines to adjust the levels of the sub word lines according to levels of the main word lines.

11. The nonvolatile memory device of claim 1, wherein each of the plurality of nonvolatile memory cells comprises a diode-controlled PRAM (Phase Change Random Access Memory) cell.

12. A nonvolatile memory device comprising:
    a memory cell array including a plurality of nonvolatile memory cells arranged in a matrix including a plurality of rows of the nonvolatile memory cells;
    a plurality of sub-word lines wherein each of the plurality of sub-word lines is coupled with nonvolatile memory cells of a respective row of the matrix;
    a plurality of main word lines;
    a row decoder coupled between the plurality of main word lines and the plurality of sub-word lines wherein the row decoder is configured to adjust levels of the plurality of sub-word lines responsive to levels of the main word lines and to disable at least one of the plurality of sub-word lines using a row bias;
    a row bias generating unit configured to provide the row bias to the row decoder in response to a biasing signal; and
    a biasing signal generating unit configured to generate the biasing signal having a positive voltage level that is determined responsive to changes in temperature.

13. The nonvolatile memory device of claim 12, wherein the biasing signal generating unit is configured to generate the biasing signal having a first positive voltage level at a first temperature and a second positive voltage level lower than the first level at a second temperature higher than the first temperature.

14. The nonvolatile memory device of claim 12, wherein the biasing signal generating unit includes a temperature sensor providing a temperature signal in response to the temperature and a biasing signal generator configured to generate a biasing signal having a positive voltage level that is adjusted responsive to the temperature signal.

15. The nonvolatile memory device of claim 12, wherein the biasing signal generating unit includes at least one diode and a plurality of resistance elements coupled in series with the at least one diode between a power supply voltage and a reference voltage.

16. The nonvolatile memory device of claim 12, wherein each of the plurality of nonvolatile memory cells comprises a diode-controlled PRAM (Phase Change Random Access Memory) cell.

17. A nonvolatile memory device comprising:
 a memory cell array including a plurality of nonvolatile memory cells arranged in a matrix including a plurality of rows of the nonvolatile memory cells; and
 a plurality of word lines wherein each of the plurality of word lines is coupled with nonvolatile memory cells of a respective row of the matrix, wherein when the plurality of word lines are disabled, a level of each of the plurality of word lines at a first temperature is equal to a level thereof at a second temperature higher than the first temperature, the level of each of the plurality of word lines being a positive voltage level.

18. The nonvolatile memory device of claim 17, further comprising:
 a row decoder configured to disable at least one of the plurality of word lines using a row bias; and
 a row biasing generating unit configured to receive an operating bias and to generate the row bias in response to a biasing signal.

19. The nonvolatile memory device of claim 18, further comprising:
 a biasing signal generating unit configured to generate the biasing signal having a level that is adjusted responsive to changes in temperature.

20. The nonvolatile memory device of claim 18, further comprising:
 an operating bias generating unit configured to generate the operating bias having a level that is adjusted responsive to changes in temperature.

21. The nonvolatile memory device of claim 18, wherein the plurality of word lines include a plurality of main word lines and a plurality of sub-word lines and wherein the row decoder is coupled between the plurality of main word lines and the plurality of sub-word lines to adjust the levels of the sub-word lines according to the levels of the main word lines.

22. The nonvolatile memory device of claim 17, wherein each of the plurality of nonvolatile memory cells comprises a diode-controlled PRAM (Phase Change Random Access Memory) cell.

* * * * *